(12) United States Patent
Chen

(10) Patent No.: US 8,208,234 B2
(45) Date of Patent: Jun. 26, 2012

(54) CIRCUIT WITH ESD PROTECTION FOR A SWITCHING REGULATOR

(75) Inventor: Peng-Sen Chen, Zhubei (TW)

(73) Assignee: ISSC Technologies Corp., Hsinchu (TW)

( * ) Notice: Subject to any disclaimer, the term of this patent is extended or adjusted under 35 U.S.C. 154(b) by 155 days.

(21) Appl. No.: 12/892,179

(22) Filed: Sep. 28, 2010

(65) Prior Publication Data

US 2012/0075757 A1 Mar. 29, 2012

(51) Int. Cl.
*H02H 3/22* (2006.01)
(52) U.S. Cl. .......................................... 361/56; 361/111
(58) Field of Classification Search .................. 361/18, 361/56, 91.1, 111
See application file for complete search history.

(56) References Cited

U.S. PATENT DOCUMENTS

| | | | | |
|---|---|---|---|---|
| 6,043,970 A | * | 3/2000 | Song et al. | 361/111 |
| 7,362,554 B2 | * | 4/2008 | Austin et al. | 361/56 |

OTHER PUBLICATIONS

Vashchenko, et al, Active Control of the Triggering Characteristics of NPN BJT, BSCR and NLDMOS-SCR Devices, Symposium on Power Semiconductor Devices and ICs, May 27, 2007.
Christoforou, et al, Active ESD Protection Design Methodology for DC/DC Converters, 2008.
Vashchenko, et al, Mixed Device-Circuit Solution for ESD Protection of High-Voltage Fast Pins, 2007.
Vashchenko, et al, Active Control of the Triggering Characteristics of NPN BJT, BSCR and NLDMOS-SCR Devices, Symposium on Power Semiconductor Devices and ICs, May 27-30, 2007.
Christoforou, et al, Active ESD Protection Design Methodology for DC/DC Converters, EOS/ESD Symposium 2008, The Netherlands.
Vashchenko, et al, Mixed Device-Circuit Solution for ESD Protection of High-Voltage Fast Pins, 45th Annual International Reliability Physics Symposium, 2007, Phoenix, AZ.

* cited by examiner

*Primary Examiner* — Danny Nguyen
(74) *Attorney, Agent, or Firm* — Ming Chow; Sinorica, LLC

(57) ABSTRACT

The present invention discloses a circuit with ESD protection and high voltage conversion for a switching regulator. It mainly comprises a non-overlap circuit, a power P-type MOS device, a parasitic diode, a digital logic AND gate, a pair of resistance and capacitance, a power N-type MOS device, an ESD N-type MOS device, a Lx pin and an ESD protection cell. The present invention can effectively decrease the on-resistance of MOS device and then improve the circuit efficiency.

20 Claims, 3 Drawing Sheets

CIRCUIT WITH ESD PROTECTION FOR A SWITCHING REGULATOR

BACKGROUND OF THE INVENTION

1. Field of the Invention

The present invention relates generally to a circuit with electrostatic discharge (ESD) protection for a switching regulator, and more particularly, to a circuit with ESD protection having lower on-resistance and high voltage conversion applied for the switching regulator.

2. Background

Electrostatic discharge (ESD) is an important issue for the design of the electronics devices, especially for the integrated circuits (ICs). The major source of ESD exposure to the ICs is from the human body, and is known as the Human Body Model (HBM) ESD source. A charge of about 0.6 C can be induced on a body capacitance of 150 pF, leading to electrostatic potentials of 4 kV or greater. Any contact by a charged human body with a grounded object, such as the pin of an IC, can result in a discharge for about 100 ns with peak currents of several amperes to the IC. A second source of ESD is from the metallic objects, and is known as the machine model (MM) ESD source. The MM ESD source is characterized by a greater capacitance and lower internal resistance than the HBM ESD source. The MM ESD model can result in ESD transients with significantly higher rise times than the HBM ESD source. A third ESD model is the charged device model (CDM). Unlike the HBM ESD source and the MM ESD source, the CDM ESD source includes situations where the IC itself becomes charged and discharges to ground. Thus, the ESD discharge current flows in the opposite direction in the IC than that of the HBM ESD source and the MM ESD source. CDM pulses also have very fast rise times compared to the HBM ESD source. A longstanding problem is that if such a high voltage is accidentally applied to the pins of an IC package, the discharge can cause gate oxide breakdown of the devices to which it is applied. The breakdown may cause immediate destruction of the device, or it may weaken the oxide enough such that failure may occur early in the operating life of the device and thereby cause later device failure in the field.

In particular, CMOS output circuits or combination input-and-output circuits use a combination of large NMOS and large PMOS transistors. These large transistors, the output transistors, are connected to the IC external terminals. The drains of the output transistors form the cathode or the anode of large diodes wherein the opposite diode terminal is connected to the respective well of each output transistor. The n type well for the PMOS transistor is connected to VDD, the positive or power supply potential in the IC. The p type well for the NMOS transistor is connected to the ground potential in the IC. In the most commercially prevalent CMOS, all p type wells are connected together through additional p type material which results in all n type wells individually forming diode connections with the one p type material at ground potential. Some ICs use ESD networks which add additional diodes in parallel to the diodes that are an integral part of the output transistors. This practice improves the diode connectivity between the IC external terminals and the power buses internal to the IC.

As shown in FIG. 1, it shows a conventional circuit with ESD protection in a switching regulator of the prior art. The signal transmitted by Lx pin of switch regulator is pulse shape waveform. For the efficiency consideration of the switch regulator, the Lx pin can not add an extra ESD protection circuit. Therefore, the tradition ESD solution of Lx for the switching regulator is to use the ESD rule layout, that is, to enlarge the distance between the drain terminal and gate terminal for power NMOS 3 and power PMOS 2 and to add extra an ESD protection cell 5. Such design increases higher on-resistance (Ron) to endure the pass of the ESD current through the power PMOS 2 to the ESD protection cell finally. Although the ESD rule layout for power NMOS 3 and power PMOS 2 can increase the on resistance (Ron) of power MOSs, it reduces the efficiency of the switch regulator. Namely, the conventional ESD design leads to trade-off between the ESD protection capability and the circuit efficiency.

U.S. Pat. No. 5,012,317, issued to Robert et al. entitled "Electrostatic discharge protection circuit" and U.S. Pat. No. 5,907,462, issued to Amitava et al. entitled "Electrostatic discharge protection circuit" and "Gate coupled SCR for ESD protection circuits" disclose similarly that changes in IC manufacturing technology often necessitate changes in the ESD protection scheme, generally because the process changes alter the ability of the ESD protection devices to operate. The silicide cladding of junctions and the incorporation of shallow trench isolation (STI) have been observed to reduce the gain of the parasitic bipolar device in the protection scheme, preventing proper triggering and conduction. The effects of these process changes are exacerbated by the continuing trend toward smaller device feature sizes, both laterally and vertically, rendering the devices ever more fragile to ESD.

However, the continued progression toward smaller device sizes has not, in many cases, relaxed the voltage requirements of the IC terminals. For example, a modern manufacturing process fabricates transistors having $0.18\mu$ channel lengths, with a gate dielectric thickness of 7 nm or less, for use in ICs that must still tolerate operating voltages of up to 7 volts at input/output terminals. Many ICs are also required to have "failsafe" inputs and outputs, meaning that the terminal cannot be clamped to any power supply rail, so that large currents are not conducted from terminal voltages when the device is in an "off" state. The "failsafe" constraint is especially important in multi-voltage systems in which the inputs and outputs are power sequenced.

According above problems, the related filed need a circuit to overcome the disadvantage of the prior art.

BRIEF SUMMARY OF THE INVENTION

It is an objective of the present invention to provide a circuit with ESD protection for a switching regulator to improve the circuit efficiency by turning off the power MOS device when ESD appears.

It is another objective of the present invention to provide a circuit with ESD protection and high voltage conversion for a switching regulator, which can effectively decrease the on-resistance of the power MOS devices in the circuit and provide a higher voltage conversion and higher ESD endurance for the switching regulator.

To achieve the above objective, the present invention provides a circuit with ESD protection for a switching regulator, comprising: a non-overlap circuit; a power P-type MOS device; a diode; a digital logic AND gate; a power N-type MOS device; a Lx pin; and an ESD protection cell. The non-overlap circuit has a first output terminal and a second output terminal, the first output terminal outputting a signal of default A and the second output terminal outputting a signal of default B. The power P-type MOS device has a gate terminal, a source terminal and a drain terminal, the gate terminal electrically connected to the first output terminal of the non-overlap circuit and receiving the signal of default A outputted from the first output terminal. The diode is electrically connected to the source terminal and the drain terminal of the power P-type MOS device, and is used for providing a pathway for an electrostatic discharge. The digital logic AND gate has two input terminals and a output terminal, one of the input terminals electrically connected to the second output terminal of the non-overlap circuit and receiving the signal of default B from the second output terminal of the non-overlap circuit, the other one of the input terminals receiving a EN signal, the output terminal providing a output signal of the digital logic AND gate. The power N-type MOS device has a gate terminal, a source terminal and a drain terminal, the gate terminal electrically connected to the output terminal of the digital logic gate of AND gate and receiving the output signal of the digital logic AND gate, the drain terminal electrically connected to the drain terminal of the power P-type MOS device, the source terminal electrically connected to a ground. The Lx pin is electrically connected to the drain terminal of the power P-type MOS device and the drain terminal of the power N-type MOS device, and is used for outputting a converted voltage. The ESD protection cell has two terminals, one terminal electrically connected to the drain terminal of the power P-type MOS device and the other terminal electrically connected to the ground, used for protecting the power P-type MOS device and the power N-type MOS device while the electrostatic discharge appears.

According to one aspect of the present invention, the signals of default B of the non-overlap circuit and the EN signal of the digital logic AND gate have different level while the electrostatic discharge appears.

According to one aspect of the present invention, the power P-type MOS device and the power N-type MOS device can be selected from Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

To achieve the above objective, the present invention provides a circuit with ESD protection and high voltage conversion for a switching regulator, comprising: a non-overlap circuit, a power P-type MOS device, a parasitic diode, a digital logic AND gate, a pair of resistance and capacitance in series, a power N-type MOS device, an ESD N-type MOS device, a Lx pin, an ESD protection cell. The non-overlap circuit has a first output terminal and a second output terminal, the first output terminal outputting a signal of default A and the second output terminal outputting a signal of default B. The power P-type MOS device has a gate terminal, a source terminal and a drain terminal, the gate terminal electrically connected to the first output terminal of the non-overlap circuit and receiving the signal of default A outputted from the first output terminal of the non-overlap circuit. The diode is electrically connected to the source terminal and the drain terminal of the power P-type MOS device, and is used for providing a pathway for an electrostatic discharge. The digital logic AND gate has two input terminals and a output terminal, one of the input terminals electrically connected to the second output terminal of the non-overlap circuit and receiving the signal of default B from the second output terminal of the non-overlap circuit, the other one of the input terminals receiving a EN signal, the output terminal providing a output signal of the digital logic AND gate. The power N-type MOS device has a gate terminal, a source terminal and a drain terminal, the drain terminal electrically connected to the drain terminal of the power P-type MOS device, the source terminal electrically connected to a ground. The RC circuit comprises a resistor and a capacitor, one of the terminals of the resistor electrically connected to the output terminal of the digital logic gate of AND gate, the resistor receiving and transmitting the output signal of the digital logic AND gate to the gate terminal of the power P-type MOS device, one of the terminals of the capacitor electrically connected to another terminal of the resistor and the gate terminal of the power N-type MOS device and another terminal of the capacitor electrically connected to the ground, used for providing a delay time while the electrostatic discharge appears. The ESD N-type MOS device has a gate terminal, a source terminal and a drain terminal, the gate terminal electrically connected to the second terminal of the non-overlap circuit, the drain terminal electrically connected to the drain terminal of the power P-type MOS device, the source terminal electrically connected to the ground, used for providing a pathway for the electrostatic discharge. The Lx pin is electrically connected to the drain terminal of the power P-type MOS device, the drain terminal of the power N-type MOS device, and the drain terminals of the ESD N-type MOS device, and is used for outputting a converted voltage. The ESD protection cell has two terminals, one terminal electrically connected to the drain terminal of the power P-type MOS device and the other terminal electrically connected to the ground, and is used for protecting the power P-type MOS device and the power N-type MOS device while the electrostatic discharge appears.

According to one aspect of the present invention, the signals of default B of the non-overlap circuit and the EN signal of the digital logic AND gate have different level while the electrostatic discharge appears.

According to one aspect of the present invention, the voltage applied on the Lx pin is less than the breakdown voltage of the gate terminal of the power N-type MOS device.

According to one aspect of the present invention, the ESD N-type MOS device follows the ESD rule layout.

According to one aspect of the present invention, the power N-type MOS device turns on with the delay time resulted from the RC circuit after the ESD N-type MOS device has turned on.

According to one aspect of the present invention, the delay time is in the range of 5 ns to 20 ns.

These and many other advantages and features of the present invention will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

In MOS integrated circuits, the inputs are normally connected to drive the gate of one or more MOS transistors. The term "MOS" is used in this application, as is now conventional, to refer to any insulated-gate-field-effect-transistor, or to integrated circuits which include such transistors. Furthermore, all pins are provided with protective circuits to prevent voltages from damaging the MOS gates. These protective circuits, normally placed between the input and output pads on a chip and the transistor gates to which the pads are connected, are designed to begin conducting, or to undergo breakdown, thereby providing an electrical path to ground (or to the power-supply rail) when excess voltage occurs. Such protection devices are designed to avalanche (passing a large amount of current, and dissipating the energy of the incoming transient) before the voltage on the input pin can reach levels which would damage the gate oxide. Since the breakdown mechanism is designed to be nondestructive, the protective circuits provide a normally open path that closes only when the high voltage appears at the input or output terminals, harmlessly discharging the node to which it is connected.

Figure 1:
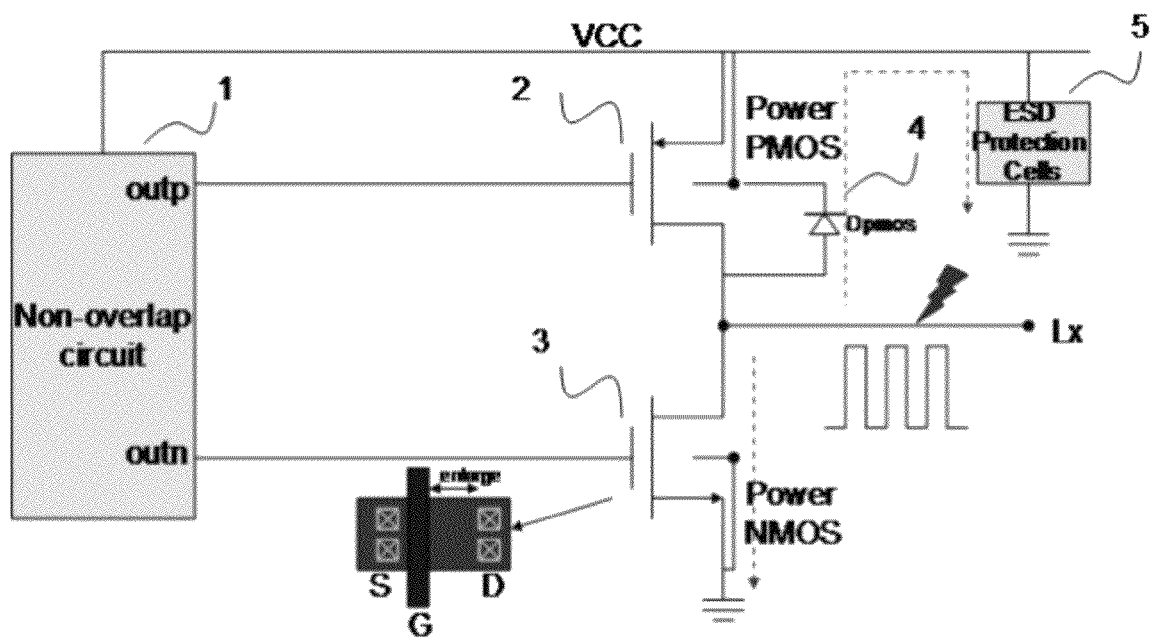
FIG. 1 shows a schematic of the circuit with ESD protection for a switching regulator of the prior art.
Figure 2:
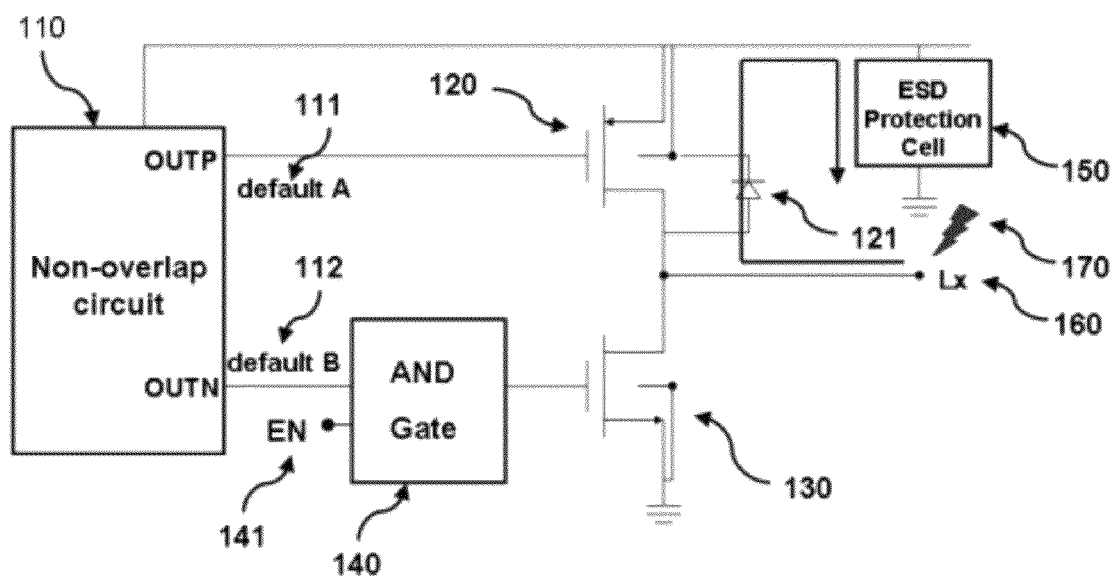
FIG. 2 shows a schematic of the circuit with ESD protection for a switching regulator according to the first embodiment of the present invention.

To understand the spirit of the present invention, please referring to FIG. 2, it shows the schematic of the circuit with ESD protection for a switching regulator 100 according to the first embodiment of the present invention, wherein the circuit 100 comprises: a non-overlap circuit 110, a power P-type MOS device 120, a diode 121, a digital logic AND gate 140, a power N-type MOS device 130, a Lx pin 160, an ESD protection cell 150.

All the devices in the circuit with ESD protection for a switching regulator 100 can be realized by using the 0.18 μm, 0.13 μm, 0.09 μm, 0.045 μm, 0.023 μm, 0.011 μm or the advanced process. The non-overlap circuit 110 has a first output terminal and a second output terminal, the first output terminal outputting a signal of default A 111 and the second output terminal outputting a signal of default B 112. The power P-type MOS device 120 has a gate terminal, a source terminal and a drain terminal.

The gate terminal of the power P-type MOS device 120 is electrically connected to the first output terminal of the non-overlap circuit 110 and receives the signal of default A 111 outputted from the first output terminal of the non-overlap circuit 110. The diode 121 is electrically connected to the source terminal and the drain terminal of the power P-type MOS device 120, and is used for providing a pathway for an electrostatic discharge 170. The digital logic AND gate 140 has two input terminals and a output terminal. One of the input terminals of the digital logic AND gate 140 is electrically connected to the second output terminal of the non-overlap circuit 110 and receives the signal of default B 112 from the second output terminal of the non-overlap circuit 110, the other one of the input terminals of the digital logic AND gate 140 is receives a EN signal 141, and the output terminal provides a output signal of the digital logic AND gate 140.

The power N-type MOS device 130 has a gate terminal, a source terminal and a drain terminal. The gate terminal of the power N-type MOS device 130 is electrically connected to the output terminal of the digital logic gate of AND gate 140, which. The drain terminal of the power N-type MOS device 130 is electrically connected to the drain terminal of the power P-type MOS device 120, and receives the output signal of the digital logic AND gate 140. The source terminal of the power N-type MOS device 130 is electrically connected to a ground. The Lx pin 160 is electrically connected to the drain terminal of the power P-type MOS device 120 and the drain terminal of the power N-type MOS device 130, and is used for outputting a converted voltage. The ESD protection cell 150 has two terminals, which one terminal is electrically connected to the drain terminal of the power P-type MOS device 120 and the other terminal is electrically connected to the ground. The ESD protection cell 150 is used for protecting the power P-type MOS device 120 and the power N-type MOS device 130 while the electrostatic discharge 170 appears. It shall be noted that the on resistance (Ron) of the MOS device will become low if the MOS device turn on, and the off resistance (Roff) of the MOS device will become high if the MOS device turn off.

While the electrostatic discharge 170 appears, namely, the current of the electrostatic discharge 170 is introduced from the Lx pin 160. The operation of the circuit with ESD protection for a switching regulator 100 can be described as followings. The signals of default A 111 and default B 112 of the non-overlap circuit 110 can be high level or low level during a period of interval. The signal of default A 111 of the non-overlap circuit 110 and the EN signal 141 of the digital logic AND gate 140 have the same level during a period of interval. The power P-type MOS device 120 and the power N-type MOS device 130 are with the different operation state during the same period of interval. The signals of default B 112 of the non-overlap circuit 110 and the EN signal 141 of the digital logic AND gate 140 have different level while the electrostatic discharge 170 appears.

Now please refer to FIG. 2 again, if VCC is zero, the signals of default A 111 and default B 112 outputted from the first and second terminal of the non-overlap circuit 110 respectively are both in the low level. Under this condition, the power P-type MOS device 120 and the power N-type MOS device 130 are both in OFF state. Consequently, resistance of the power P-type MOS device 120 and the power N-type MOS device 130 are both high and then the current of the electrostatic discharge 170 would be propagated through the pathway of the diode 121 to the ESD protection cell 150 and then to the ground finally.

If VCC is not zero, either the signal of default A 111 or the signal of default B 112 outputted from the first and second terminal of the non-overlap circuit 110 respectively is in a low level, and the other one is in a high level during the same period of interval. For example, the signal of default A 111 with a high level would make the power P-type MOS device 120 to be ON state, in the other hand, the default B 112 with a low level and the EN 141 with a high level inputted to the digital logic AND gate 140 would output a signal with a low level, then the power N-type MOS device 130 is in OFF state. Under this condition, the current of the electrostatic discharge 170 would be only propagated through the pathway of the diode 121, the ESD protection cell 150 and then to the ground finally.

For another example, the default B 112 with high level and the EN 141 with low level inputted to the digital logic AND gate 140 would output a signal with low level which makes the power N-type MOS device 130 is in OFF state, in the other hand, the default A 111 with low level would make the power P-type MOS device 120 in OFF state. Under this condition, the current of the electrostatic discharge 170 would be also propagated through the pathway of the diode 121, the ESD protection cell 150 and to the ground finally.

The power P-type MOS device 120 and power N-type MOS device 130 are with the different operation state during the same period of interval. These descriptions of the first embodiment mainly indicate that the current of the electrostatic discharge 170 would always propagated through the pathway of the diode 121 to the ESD protection cell 150 and then to the ground. The purpose of the first embodiment is to protect the power N-type MOS device 130 which is without the ESD protection layout. In the first embodiment, the digital logic AND gate 140 is used to turn off the power N-type MOS device when the electrostatic discharge 170 appears. However, the voltage applied on the Lx pin 160 may be raised and higher than the breakdown voltage of the power N-type MOS device 130, causing the power N-type MOS device 130 breakdown or snap-back. Therefore, the voltage applied on the Lx pin 160 is required to be less than the breakdown voltage of the power N-type MOS device 130 and the circuit 100 has an ESD capability of Human Body Model (HBM) higher than 8 kV.

Figure 3:
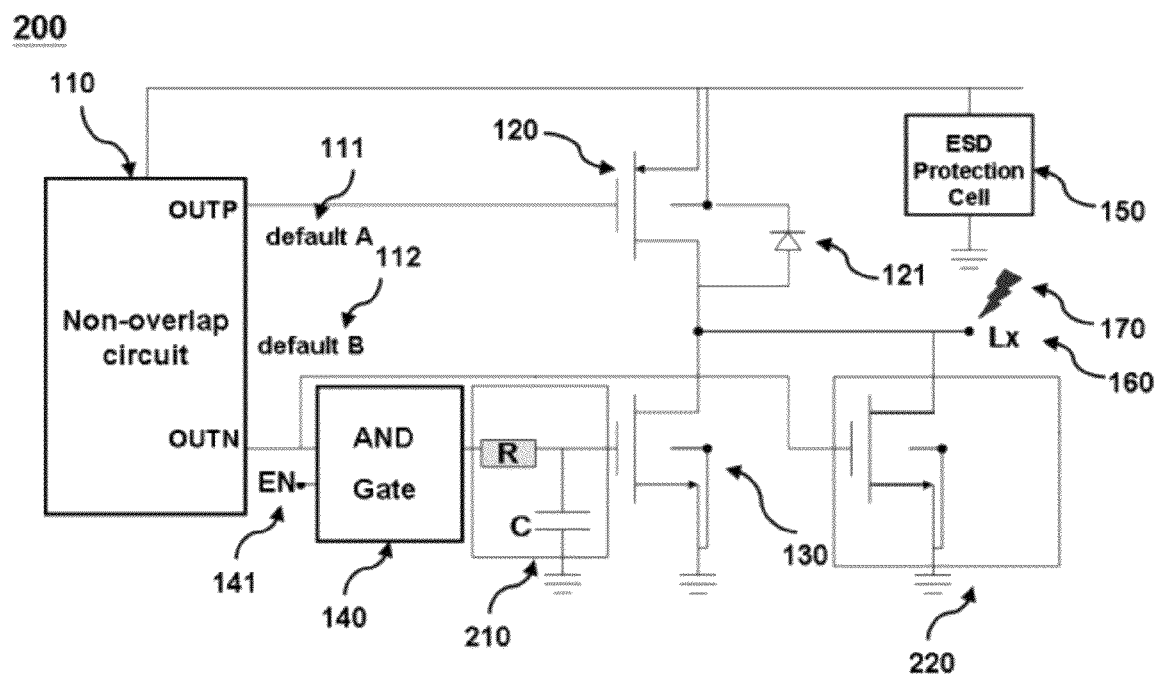
FIG. 3 shows a schematic of the circuit with ESD protection and high voltage conversion for a switching regulator according to the second embodiment of the present invention.

In order to overcome the problem of the raised voltage applied on the Lx pin 160 making the breakdown of the power N-type MOS device 130, the second embodiment is provided. Now please refer to FIG. 3, it shows the schematic of circuit with ESD protection for a switching regulator 200 according to the second embodiment of the present invention. The circuit with ESD protection and high voltage conversion for a switching regulator 200 further comprises: a non-overlap circuit 110, a power P-type MOS device 120, a diode 121, a digital logic AND gate 140, a pair of resistance and capacitance in series 210, a power N-type MOS device 130, an ESD N-type MOS device 220, a Lx pin 160, an ESD protection cell 150. Similarly, all devices in the circuit with ESD protection and high voltage conversion for a switching regulator 200 can be realized by using the 0.18 µm, 0.13 µm, 0.09 µm, 0.045 µm, 0.023 µm, 0.011 µm or the advanced process.

The non-overlap circuit 110 has a first output terminal and a second output terminal, which the first output terminal outputs a signal of default A 111 and the second output terminal outputs a signal of default B 112. The power P-type MOS device 120 has a gate terminal, a source terminal and a drain terminal. The gate terminal of the power P-type MOS device 120 is electrically connected to the first output terminal of the non-overlap circuit 110 and receives the signal of default A 111 outputted from the first output terminal of the non-overlap circuit 110. The diode 121 is electrically connected to the source terminal and the drain terminal of the power P-type MOS device 120, and is used for providing a pathway for an electrostatic discharge 170. The digital logic AND gate 140 has two input terminals and a output terminal. One of the input terminals of the digital logic AND gate 140 is electrically connected to the second output terminal of the non-overlap circuit 110 and receives the signal of default B 112 from the second output terminal of the non-overlap circuit 110. The other one of the input terminals of the digital logic AND gate 140 receives a EN signal 141 and the output terminal of the digital logic AND gate 140 provides a output signal of the digital logic AND gate 140.

The power N-type MOS device 130 has a gate terminal, a source terminal and a drain terminal. The drain terminal of the power N-type MOS device 130 is electrically connected to the drain terminal of the power P-type MOS device 120, and the source terminal of the power N-type MOS device 130 is electrically connected to a ground. The RC circuit 210 comprises a resistor and a capacitor. One of the terminals of the resistor is electrically connected to the output terminal of the digital logic gate of AND gate 140. And the resistor receives and transmits the output signal of the digital logic AND gate 140 to the gate terminal of the power P-type MOS device 120. One of the terminals of the capacitor is electrically connected to another terminal of the resistor and the gate terminal of the power N-type MOS device 130, and another terminal of the capacitor is electrically connected to the ground. The RC circuit 210 is used for providing a delay time while the electrostatic discharge 170 appears. The ESD N-type MOS device 220 has a gate terminal, a source terminal and a drain terminal. The gate terminal of the ESD N-type MOS device 220 is electrically connected to the second terminal of the non-overlap circuit 110, the drain terminal of the ESD N-type MOS device 220 is electrically connected to the drain terminal of the power P-type MOS device 120, and the source terminal of the ESD N-type MOS device 220 is electrically connected to the ground. The ESD N-type MOS device 220 is used for providing a pathway for the electrostatic discharge 170. The Lx pin 160 is electrically connected to the drain terminal of the power P-type MOS device 120, the drain terminal of the power N-type MOS device 130 and the drain terminals of the ESD N-type MOS device 220, and is used for outputting a converted voltage. The ESD protection cell 150 has two terminals, which one terminal is electrically connected to the drain terminal of the power P-type MOS device 120 and the other terminal is electrically connected to the ground. The ESD protection cell 150 is used for protecting the power P-type MOS device 120 and the power N-type MOS device 130 while the electrostatic discharge appears.

It should be note that the power P-type MOS device 120, the power N-type MOS device 130, and the ESD N-type MOS device 220 can be replaced and selected from Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

Furthermore, the ON/OFF state of the power P-type MOS device 120, the power N-type MOS device 130 and the ESD N-type MOS device 220 are determined by the level of the signals of default A 111 and default B 112 as receiving by the gate terminal of the power P-type MOS device 120, the gate terminal of the power N-type MOS device 130 and the gate terminal of the ESD N-type MOS device 220. It is noted that the RC circuit 210 will cause a delay time, defined as the resistance of the resistor multiple the capacitance of the capacitor.

While the electrostatic discharge 170 appears, namely, the current of the electrostatic discharge 170 is introduced from the Lx pin 160, the operation of the circuit with ESD protection and high voltage conversion for a switching regulator 200 can be described as followings:

Now please refer to FIG. 3 again, if VCC is zero, the signals of default A 111 and default B 112 outputted from the non-overlap circuit 110 are both in the low level. Under this condition, the power P-type MOS device 120 and the power N-type MOS device 130 are both in OFF state. Consequently, the current of the electrostatic discharge 170 would be propagated through the pathway of the diode 121, the ESD protection cell 150 and then to the ground finally.

If VCC is not zero, either the signal of default A 111 or the signal of default B 112 outputted from the non-overlap circuit 110 is in the low level, and the other one is in high level during the same period of interval. There will four conditions. For the first example, the signal of default A 111 with a high level would make the power P-type MOS device 120 to be ON state, in the other hand, the signal of default B 112 with a low level and the EN 141 with a high level inputted to the digital logic AND gate 140 would output a signal with a low level which makes the power N-type MOS device 130 is to be OFF state. Under this condition, only one pathway for electrostatic discharge 170 is needed. The current of the electrostatic discharge 170 would be also propagated through the pathway of the diode 121, the ESD protection cell 150 and then to the ground finally. For the second example, the signal of default A 111 with a high level would make the power P-type MOS device 120 to be ON state, in the other hand, the signal of default B 112 with a low level and the EN 141 with a low level inputted to the digital logic AND gate 140 would output a signal with a high level which makes the power N-type MOS device 130 is to be ON state. Since the high level outputted from the digital logic AND gate 140 passes through the RC circuit 210 and then has a delay time, therefore the power N-type MOS device 130 would be turn on with a delay time after the ESD N-type MOS device 220 starts to be ON state. Namely, the current of the electrostatic discharge 170 would not pass by the power N-type MOS device 130 since the RC circuit 210 would provide a delay time, which results in the current of the electrostatic discharge 170 propagates through the ESD N-type MOS device 220 before the power N-type MOS device 130 receives the signal with a high level outputted by the digital logic AND gate 140. Under this condition, there are two pathways for electrostatic discharge 170. One for the current of the electrostatic discharge 170 would be propagated through the pathway of the diode 121, the ESD protection cell 150 and then to the ground, and the other is through the pathway of the ESD N-type MOS device 220 and to ground directly.

For the third example, the signal of default A 111 with a low level would make the power P-type MOS device 120 to be OFF state, in the other hand, the signal of default B 112 with a high level and the EN 141 with a low level inputted to the digital logic AND gate 140 would output a signal with a low level which makes the power N-type MOS device 130 is to be OFF state. Under this condition, no pathway for electrostatic discharge 170 is required since the resistance of the power MOS device is high. For the fourth example, the signal of default A 111 with a low level would make the power P-type MOS device 120 to be OFF state, in the other hand, the signal of default B 112 with a high level and the EN 141 with a high level inputted to the digital logic AND gate 140 would output a signal with a high level which makes the power N-type MOS device 130 is to be ON state. Again, since the high level outputted from the digital logic AND gate 140 passes through the RC circuit 210 and then has a delay time, therefore the power N-type MOS device 130 would be turn on with a delay time after the ESD N-type MOS device 220 starts to be ON state. Namely, the current of the electrostatic discharge 170 would not pass by the power N-type MOS device 130 since the RC circuit 210 would provide a delay time, which results in the current of the electrostatic discharge 170 propagates through the ESD N-type MOS device 220 before the power N-type MOS device 130 receives the signal with a high level outputted by the digital logic AND gate 140. Under this condition, there is only one pathway for electrostatic discharge 170. The current of the electrostatic discharge 170 would be propagated through the pathway of the ESD N-type MOS device 220 and to ground directly.

In sum, the current of the electrostatic discharge 170 would be propagated through the pathway of the diode 121, the ESD protection cell 150 and to the ground, moreover, through the pathway of the ESD N-type MOS device 220 and to ground directly. The signal of default A of the non-overlap circuit and the EN signal of the digital logic AND gate can have the same level during a period of interval. The power P-type MOS device and the power N-type MOS device can be with the different operation state during the same period of interval. The signals of default B of the non-overlap circuit and the EN signal of the digital logic AND gate can have different level while the electrostatic discharge appears. It is noted that the voltage applied on the Lx pin is less than the breakdown voltage of the terminal of the power N-type MOS device, and the ESD N-type MOS device follows the ESD rule layout. Moreover, the ESD N-type MOS device will always turn on to lower the on-resistance of the power N-type MOS device if the power N-type MOS device turns on. And, the ESD N-type MOS device 220 can be designed to be located below the Lx pin, Namely, the ESD N-type MOS device 220 is not only a ESD protection circuit but also a actual circuit which can reduce the on resistance of the power MOS device.

The power N-type MOS device 130 is with the different operation state as compared to the power P-type MOS device 120 during the same period of interval. The delay time provided by the RC circuit 210 is about 5 ns to 20 ns where the preferred one is 10 ns.

These descriptions of the second embodiment mainly indicate that the current of the electrostatic discharge 170 would propagated through the pathway of the diode 121, the ESD protection cell 150 and then to the ground or through the pathway of the ESD N-type MOS device 220 and then to ground directly. The purpose of the second embodiment is to protect the power N-type MOS device 130 which is without the ESD protection layout, besides, the addition of the ESD N-type MOS device 220 decreases the propagated time of the current of the electrostatic discharge 170 within the circuit.

The following table I shows the performance comparisons of the prior art, the first embodiment and the second embodiment.

TABLE I

|  | Prior art | First embodiment | Second embodiment |
|---|---|---|---|
| ESD capability of HBM | 1.5 to 2 kV | >8 kV | >8 kV |
| Switching efficiency (boost Vout = 2.8 V @ Vin = 2 V) | 83% | 86% | >86% |

The functions and the advantages of the present invention have been shown. Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A circuit with ESD protection for a switching regulator, comprising:
    a non-overlap circuit, having a first output terminal and a second output terminal, the first output terminal outputting a signal of default A and the second output terminal outputting a signal of default B;
    a power P-type MOS device, having a gate terminal, a source terminal and a drain terminal, the gate terminal electrically connected to the first output terminal of the non-overlap circuit and receiving the signal of default A outputted from the first output terminal of the non-overlap circuit;
    a diode, electrically connected to the source terminal and the drain terminal of the power P-type MOS device, used for providing a pathway for an electrostatic discharge;
    a digital logic AND gate, having two input terminals and a output terminal, one of the input terminals electrically connected to the second output terminal of the non-overlap circuit and receiving the signal of default B from the second output terminal of the non-overlap circuit, the other one of the input terminals receiving a EN signal, the output terminal providing a output signal of the digital logic AND gate;

a power N-type MOS device, having a gate terminal, a source terminal and a drain terminal, the gate terminal electrically connected to the output terminal of the digital logic gate of AND gate and receiving the output signal of the digital logic AND gate, the drain terminal electrically connected to the drain terminal of the power P-type MOS device, the source terminal electrically connected to a ground;

a Lx pin, electrically connected to the drain terminal of the power P-type MOS device and the drain terminal of the power N-type MOS device, used for outputting a converted voltage; and an ESD protection cell, having two terminals, one terminal electrically connected to the drain terminal of the power P-type MOS device and the other terminal electrically connected to the ground, used for protecting the power P-type MOS device and the power N-type MOS device while the electrostatic discharge appears.

2. The circuit with ESD protection for a switching regulator as claimed in claim 1, wherein the signals of default A and default B of the non-overlap circuit can be high level or low level during a period of interval.

3. The circuit with ESD protection for a switching regulator as claimed in claim 1, wherein the signal of default A of the non-overlap circuit and the EN signal of the digital logic AND gate have the same level during a period of interval.

4. The circuit with ESD protection for a switching regulator as claimed in claim 1, wherein the power P-type MOS device and the power N-type MOS device are with the different operation state during the same period of interval.

5. The circuit with ESD protection for a switching regulator as claimed in claim 1, wherein the signals of default B of the non-overlap circuit and the EN signal of the digital logic AND gate have different level while the electrostatic discharge appears.

6. The circuit with ESD protection for a switching regulator as claimed in claim 1, wherein the voltage applied on the Lx pin is less than the breakdown voltage of the power N-type MOS device.

7. The circuit with ESD protection for a switching regulator as claimed in claim 1, wherein the circuit has an ESD capability of Human Body Model (HBM) higher than 8 kV.

8. A circuit with ESD protection for a switching regulator, comprising:

a non-overlap circuit, having a first output terminal and a second output terminal, the first output terminal outputting a signal of default A and the second output terminal outputting a signal of default B;

a power P-type MOS device, having a gate terminal, a source terminal and a drain terminal, the gate terminal electrically connected to the first output terminal of the non-overlap circuit and receiving the signal of default A outputted from the first output terminal of the non-overlap circuit;

a diode, electrically connected to the source terminal and the drain terminal of the power P-type MOS device, used for providing a pathway for an electrostatic discharge;

a digital logic AND gate, having two input terminals and a output terminal, one of the input terminals electrically connected to the second output terminal of the non-overlap circuit and receiving the signal of default B from the second output terminal of the non-overlap circuit, the other one of the input terminals receiving a EN signal, the output terminal providing a output signal of the digital logic AND gate;

a power N-type MOS device, having a gate terminal, a source terminal and a drain terminal, the drain terminal electrically connected to the drain terminal of the power P-type MOS device, the source terminal electrically connected to a ground;

a RC circuit, comprising a resistor and a capacitor, one of the terminals of the resistor electrically connected to the output terminal of the digital logic gate of AND gate, the resistor receiving and transmitting the output signal of the digital logic AND gate to the gate terminal of the power P-type MOS device, one of the terminals of the capacitor electrically connected to another terminal of the resistor and the gate terminal of the power N-type MOS device and another terminal of the capacitor electrically connected to the ground, used for providing a delay time while the electrostatic discharge appears;

an ESD N-type MOS device, having a gate terminal, a source terminal and a drain terminal, the gate terminal electrically connected to the second terminal of the non-overlap circuit, the drain terminal electrically connected to the drain terminal of the power P-type MOS device, the source terminal electrically connected to the ground, used for providing a pathway for the electrostatic discharge;

a Lx pin, electrically connected to the drain terminal of the power P-type MOS device, the drain terminal of the power N-type MOS device and the drain terminals of the ESD N-type MOS device, used for outputting a converted voltage; and an ESD protection cell, having two terminals, one terminal electrically connected to the drain terminal of the power P-type MOS device and the other terminal electrically connected to the ground, used for protecting the power P-type MOS device and the power N-type MOS device while the electrostatic discharge appears.

9. The circuit with ESD protection for a switching regulator as claimed in claim 8, wherein the signals of default A and default B of the non-overlap circuit can be high level or low level during a period of interval.

10. The circuit with ESD protection for a switching regulator as claimed in claim 8, wherein the signal of default A of the non-overlap circuit and the EN signal of the digital logic AND gate have the same level during a period of interval.

11. The circuit with ESD protection for a switching regulator as claimed in claim 8, wherein the power P-type MOS device and the power N-type MOS device are with the different operation state during the same period of interval.

12. The circuit with ESD protection for a switching regulator as claimed in claim 8, wherein the signals of default B of the non-overlap circuit and the EN signal of the digital logic AND gate have different level while the electrostatic discharge appears.

13. The circuit with ESD protection for a switching regulator as claimed in claim 8, wherein the voltage applied on the Lx pin is less than the breakdown voltage of the terminal of the power N-type MOS device.

14. The circuit with ESD protection for a switching regulator as claimed in claim 8, wherein the circuit has an ESD capability of Human Body Model (HBM) higher than 8 kV.

15. The circuit with ESD protection for a switching regulator as claimed in claim 8, wherein the ESD N-type MOS device follows the ESD rule layout.

16. The circuit with ESD protection for a switching regulator as claimed in claim 8, wherein the power N-type MOS device turns on with the delay time resulted from the RC circuit after the ESD N-type MOS device has turned on.

17. The circuit with ESD protection for a switching regulator as claimed in claim 16, wherein the delay time is in the range of 5 ns to 20 ns.

18. The circuit with ESD protection for a switching regulator as claimed in claim 8, wherein the ESD N-type MOS device will always turn on to lower the on-resistance of the power N-type MOS device if the power N-type MOS device turns on.

19. The circuit with ESD protection for a switching regulator as claimed in claim 8, wherein the ESD N-type MOS device is located below the Lx pin.

20. The circuit with ESD protection for a switching regulator as claimed in claim 8, wherein the power P-type MOS device, the power N-type MOS device and the ESD N-type MOS device can be replaced and selected from Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS).

* * * * *